United States Patent
Nguyen et al.

(10) Patent No.: US 6,680,648 B2
(45) Date of Patent: Jan. 20, 2004

(54) HIGH POWER AMPLIFIER PREDISTORTER SYSTEM

(75) Inventors: Tien M. Nguyen, Placentia, CA (US); James Yoh, Palos Verdes Peninsula, CA (US); Charles C. Wang, Alhambra, CA (US); Diana M. Johnson, Redondo Beach, CA (US)

(73) Assignee: The Aerospace Corporation, El Segundo, CA (US)

( * ) Notice: Subject to any disclaimer, the term of this patent is extended or adjusted under 35 U.S.C. 154(b) by 0 days.

(21) Appl. No.: 10/093,681

(22) Filed: Mar. 8, 2002

(65) Prior Publication Data

US 2003/0169108 A1 Sep. 11, 2003

(51) Int. Cl.[7] .................................................. H03F 1/26
(52) U.S. Cl. .......................... 330/149; 375/297; 455/63
(58) Field of Search .......................... 330/149; 375/296, 375/297; 455/63

(56) References Cited

U.S. PATENT DOCUMENTS

| 6,549,067 | B1 | * | 4/2003 | Kenington | ................... | 330/52 |
| 6,583,739 | B1 | * | 6/2003 | Kenington | ................... | 341/118 |
| 6,600,792 | B2 | * | 7/2003 | Antonio et al. | ............. | 375/297 |

* cited by examiner

Primary Examiner—Henry Choe
(74) Attorney, Agent, or Firm—Derrick Michael Reid

(57) ABSTRACT

An adaptive predistorter system receives and predistorts an input signal so as to linearize the output signal of a nonlinear high power amplifier amplifying the predistorted input signal using closed-loop feedback of the output signal in complex form at baseband so as to adaptively change the amount of the predistortion of the input signal in the presence of high power amplifier changing characteristics.

15 Claims, 4 Drawing Sheets

ADAPTIVE PREDISTORTER SYSTEM

ADAPTIVE PREDISTORTER SYSTEM

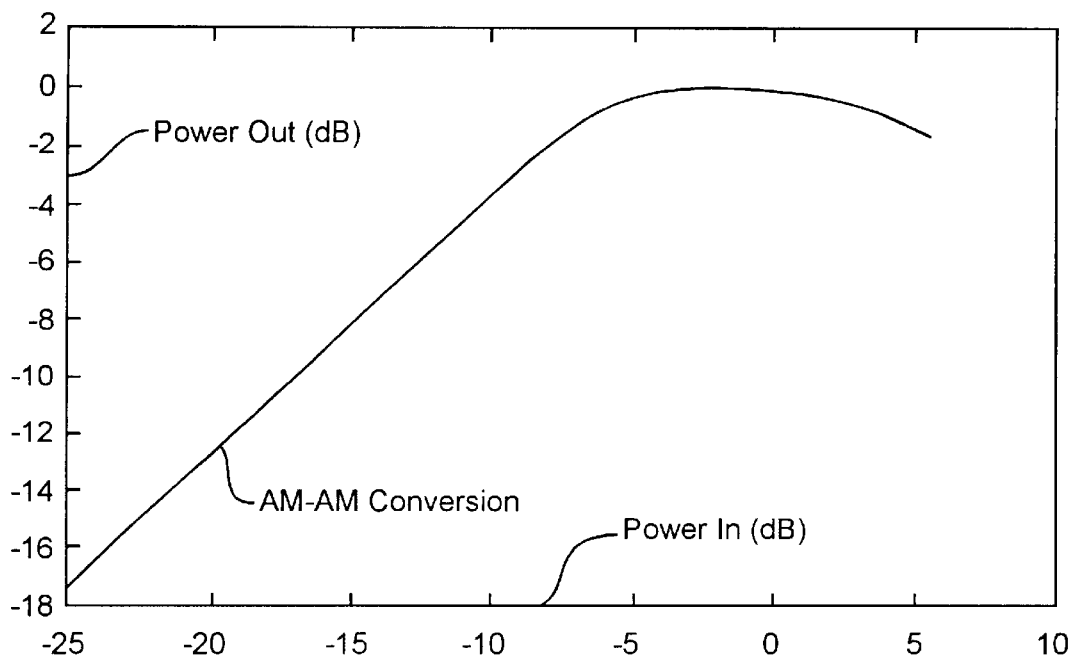
FIG. 3  INPUT POWER vs. OUTPUT POWER CONVERSION
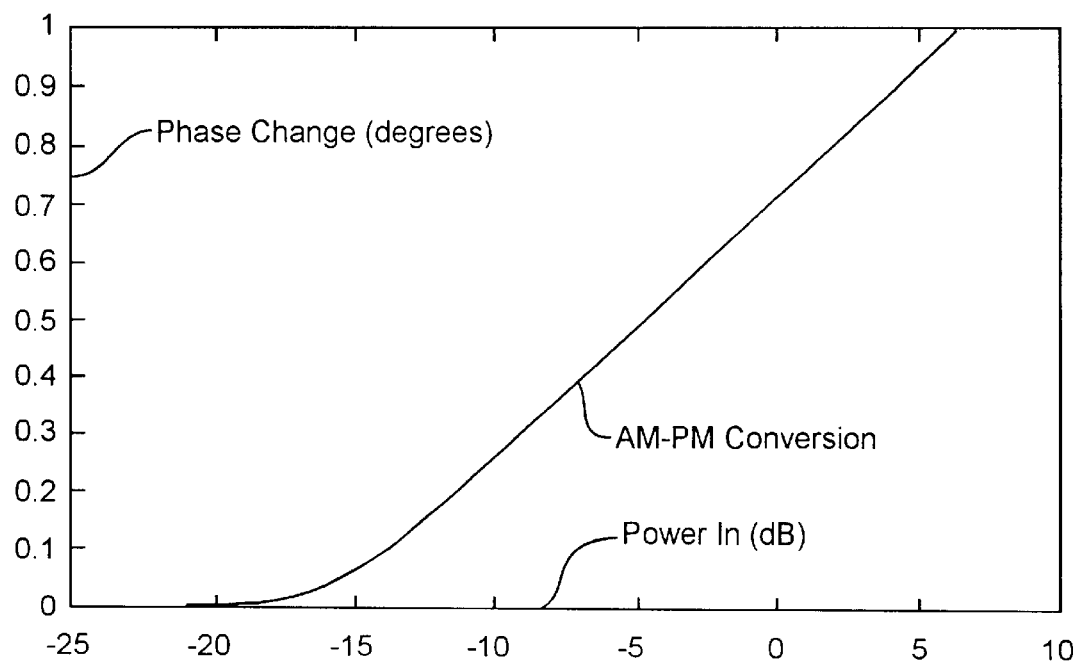
FIG. 4  INPUT POWER vs. OUTPUT PHASE

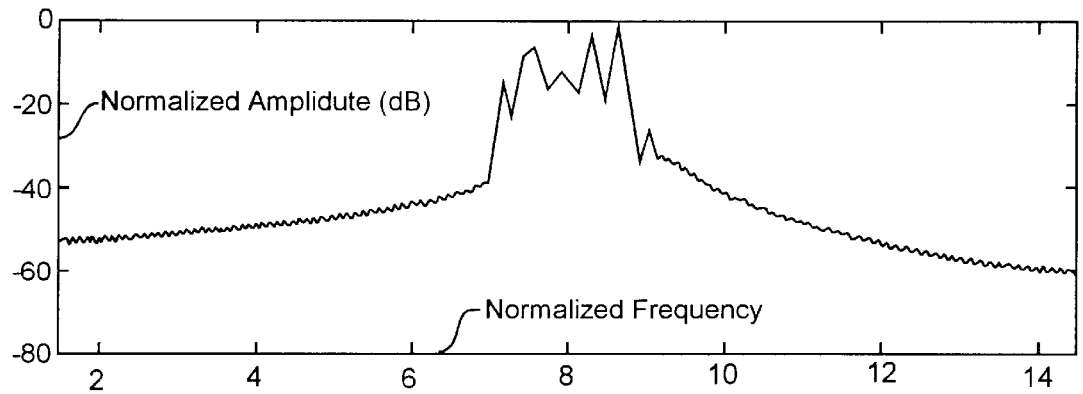
FIG. 5A  INPUT POWER SPECTRAL DENSITY
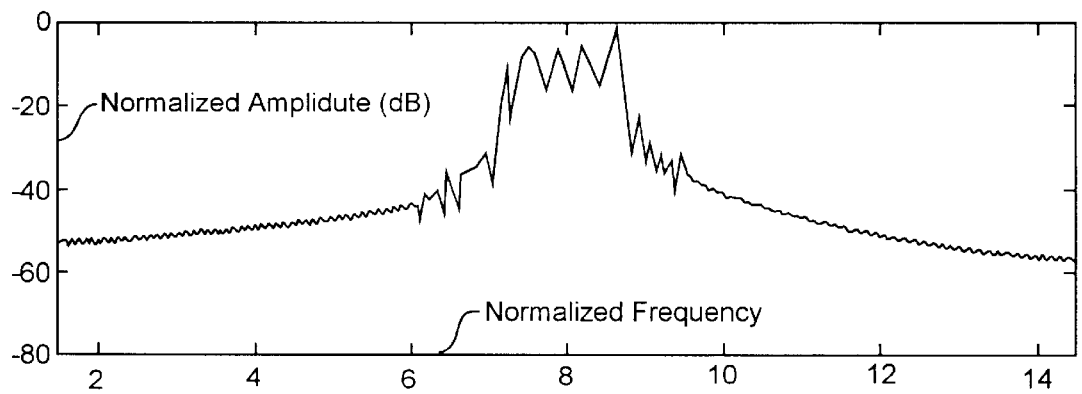
FIG. 5B  HPA OUTPUT POWER SPECTRAL DENSITY
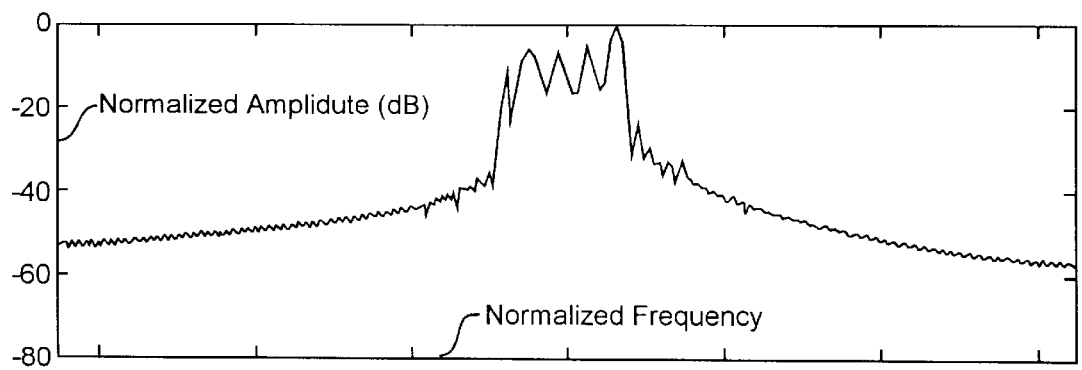
FIG. 5C  PREDISTORTED OUTPUT POWER SPECTRAL DENSITY

HIGH POWER AMPLIFIER PREDISTORTER SYSTEM

REFERENCE TO RELATED APPLICATION

The present application is related to applicant's copending application entitled High Power Amplifier Linearization Method using Extended Saleh Model Predistortion" Ser. No. 09/533,571, filed Mar. 23, 2000, by the same inventors. The present application is also related to applicant's issued patent entitled "High Power Amplifier Linearization Method using Modified Linear-Log Model Predistortion" U.S. Pat. No. 6,307,435, issued Oct. 23, 2001, here incorporated by reference as there fully setforth.

STATEMENT OF GOVERNMENT INTEREST

The invention was made with Government support under contract No. F04701-00-C-0009 by the Department of the Air Force. The Government has certain rights in the invention.

FIELD OF THE INVENTION

The invention relates to the field of predistorters and linearization of high power amplification. More particularly, the present invention relates to feedback complex processing of input signals for improved linearization of high power amplifiers.

BACKGROUND OF THE INVENTION

Satellite systems have applications from television broadcasts to military communications requiring reliable transfer of information from one location to another. All satellite systems incorporate the use of high power amplifiers (HPA) to boost signal strength for transmission. For example, HPAs are used by the Global Broadcasting Service to boost the signal strength of transmitted data between satellites and ground-based stations. When using satellites for ground based communications, the HPAs provide the transmitted signal with ample signal strength to account for signal attenuation due to path loss and other disturbances. Amplifying the input signal to levels required for reliable transmission using currently available HPAs, such as solid state power amplifiers or traveling wave tube amplifiers, introduces amplitude distortion and phase distortion. HPAs are nonlinear devices that induce distortion of the original signal before transmission. Nonlinear operation of the HPAs operating in the saturation region at point of maximum power transfer induces the distortion. Both the amplitude and phase of the original input signal are distorted compromising the integrity of the output signal. Because the HPAs are nonlinear devices, amplification of an input signal results in amplitude modulation to phase modulation (AM-PM) distortion and amplitude modulation to amplitude modulation (AM-AM) distortion of the output signal. The amplitude and phase distortion of the HPAs results in a distorted high power output signal. It is desirable to reduce the amplitude and phase distortion for continuous reliable communications. The amplitude and phase distortion can cause intermodulation components and spectral regrowth, which are undesirable effects leading to poor communications. For example, intermodulation components and spectral regrowth can cause adjacent channel interference to other communication services in addition to a loss in transmit power. The effects of amplitude and phase distortion can cause signal distortion that can degrade bit error rate (BER) performance during communications. The amplified signal exhibits undesirable spectral regrowth characterized as added signal spectra outside of the desired bandwidth with an additional increase in the BER.

One method to reduce the undesirable effects of the amplitude and phase distortion is to predistort the input signal so as to linearize the HPAs output with the input signal so that the resultant amplified output signal has reduced amplitude and phase distortion and the power spectrum remains within the communication bandwidth without spectral regrowth. Predistortion involves using known properties of HPAs in order to provide input data to an algorithm that predistorts the original signal. When the predistorted input signal is passed through the HPAs, the power spectrum of the transmitted output signal is nearly identical to that of the original signal before predistortion and amplification. In essence, the predistorter corrects for the nonlinear behavior of the HPAs so that the resulting amplification appears as a linear process.

Previous methods to predistort the original input signal use a Saleh model, an extended Saleh model, a linear-log model, and a modified linear-log model. The use of each of these methods disadvantageously requires advance knowledge of the characteristics of the HPA with the predistortion compensating for distortion effects. These predistorter models can correct for nonlinear behavior exhibited by HPAs to varying degrees. These models rely on an erroneous assumption that the HPAs performance will remain constant during the life of the HPAs. In reality, however, the HPAs are subject to change as the HPAs do not have constant characterizations. The use of each of these models disadvantageously requires a priori known characteristics of the HPAs in order to design a predistorter that then disadvantageously does not change over time. Therefore, these predistorter models are effectively nonadaptive to changing HPA characterizations. The problem inherent with these nonadaptive models is a lack of adaptive predistortion to account for changes in the HPA characteristics. The characteristics of the HPAs may change with any number of known or unknown variables such as age or ambient temperature. As a consequence, these nonadaptive predistortion methods disadvantageously provide nonlinear results under varying HPAs operating conditions and changing HPA characteristics. A more desirable solution is a predistorter that linearizes the HPAs over changing HPA characteristics.

Because the transmitted signal may be communicated at a very high carrier frequency, at least on the order of megahertz, signal processing at the modulated frequency requires a very costly high speed signal processing system. Additionally, algorithms that mitigate the distortion can not be executed on board a satellite due to the need to first characterize the HPA performance on the ground. As a result, the nonadaptive predistortion methods disadvantageously perform the signal processing at high speed using expensive signal processing systems. The prior predistorter models are disadvantageously implemented in high speed processes that are statically configured on the ground for known static HPA characteristics and hence are nonadaptive. These and other disadvantages are solved or reduced using the invention.

SUMMARY OF THE INVENTION

An object of the invention is to provide a system for linearizing the output of a high power amplifier.

Another object of the invention is to provide a system for linearizing the output of a high power amplifier through predistortion.

Yet another object of the invention is to provide a system for linearizing the output of a high power amplifier through adaptive predistortion.

Another object of the invention is to provide a system for linearizing the output of a high power amplifier through complex adaptive predistortion.

Another object of the invention is to provide a system for linearizing the output of a high power amplifier through complex adaptive predistortion using an adaptive predistorter operating at baseband.

Still another object of the invention is to provide a system for linearizing the output of a high power amplifier having changing characteristics.

The invention is directed to a system that predistorts an original input signal to compensate for undesired amplitude and phase distortion while reducing spectral regrowth during high power amplification. The input signal is predistorted so that the resultant output signal, when amplified, has the same power spectrum as the original input signal after baseband filtering. The predistorter functions to linearize the operation of the high power amplifier (HPA) having a resultant one-to-one spectral correlation between the input and output power. The system provides adaptive predistortion of the input signal for an HPA with unknown or varying characteristics.

The adaptive predistorter uses closed-loop feedback of the HPA output signal and the original input signal for controlled adaptive changing of the amount of the predistortion and hence adaptively operates to linearize the HPA output in the presence of changing HPA characteristics. The closed-loop feedback operates on the input signal and output signal in a complex form and at baseband. The improved adaptive predistorter uses the changing characteristics of the HPA as defined by signal measurements and continuously adapts the amount of predistortion of the original input signal to compensate for the nonlinear distortion. The adaptive predistortion processing algorithm can be implemented on-board a satellite. These and other advantages will become more apparent from the following detailed description of the preferred embodiment.

BRIEF DESCRIPTION OF THE DRAWINGS

FIG. 3 is a graph of input power versus output power.

FIG. 4 is a graph of input power versus output phase.

FIG. 5A is a graph of input power spectral density.

FIG. 5B is a graph of a high power amplifier output power spectral density without adaptive predistortion.

FIG. 5C is a graph of a predistorted high power amplifier output power spectral density.

DETAILED DESCRIPTION OF THE PREFERRED EMBODIMENT

Figure 1:
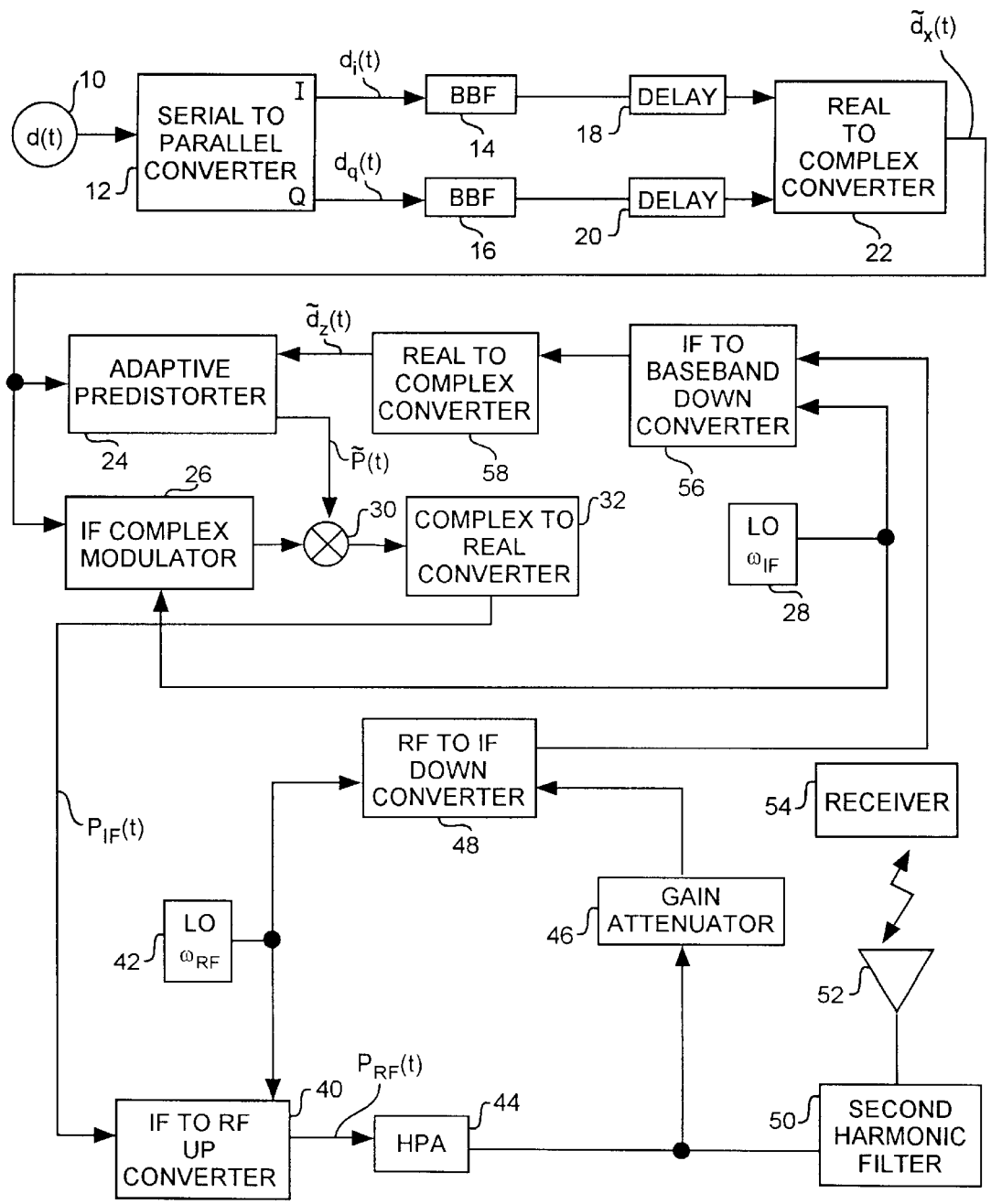
FIG. 1 is a block diagram of an adaptive predistorter system.

An embodiment of the invention is described with reference to the figures using reference designations as shown in the figures. Referring to FIG. 1, an adaptive predistorter system is a transmitter with adaptive predistortion for use in a communications system. A serial data signal $d(t)$ is an original input signal 10 and is converted by a serial-to-parallel converter 12 into parallel $d_i(t)$ and $d_q(t)$ signals that are I and Q channel binary signals respectively filtered through an I channel complex baseband filter 14 and a Q complex baseband filter 16, and then respectively delayed by an I channel delay 18 and a Q channel delay 20, and then combined using a real to complex converter 22 for providing a baseband undistorted complex input signal $\tilde{d}_x(t)$. The inphase binary signal $d_i(t)$ and the quadrature binary signal $d_q(t)$ pass through the complex baseband filters 14 and 16 using a filtering operator $\Im$. The delays 18 and 20 introduce a delay $T_d$ prior to real to complex conversion at baseband by the converter 22 providing the baseband undistorted complex input signal $\tilde{d}_x(t)$. In quadrature, the two I and Q channel signals into the converter 22 are orthogonal and do not interfere with each other. The I and Q signals may be quadrature phase shift keying signals that are filtered to convert the input signals into digital video broadcasting waveforms. The I and Q channel signals are combined by the real to complex converter 22 to create the baseband complex input signal $\tilde{d}_x(t)$ where $\tilde{d}_x(t)=\Im[d_i(t-T_d)]+j\Im[d_q(t-T_d)]$ with $j^2=-1$.

The baseband undistorted complex input signal $\tilde{d}_x(t)$ is fed into an adaptive predistorter 24 that provides a baseband predistorted complex signal $\tilde{P}(t)$ that is fed to a complex mixer 30. The baseband undistorted complex input signal $\tilde{d}_x(t)$ is also fed into an intermediate frequency (IF) complex modulator 26 upconverting the baseband undistorted complex input signal $\tilde{d}_x(t)$ to an IF undistorted complex signal. The IF complex modulator 26 receives an IF oscillator signal $\omega_{IF}$ from an IF local oscillator 28 for upconverting the baseband undistorted complex input signal $\tilde{d}_x(t)$. The IF undistorted complex signal is communicated to the complex mixer 30 for mixing the baseband predistorted complex signal $\tilde{P}(t)$ with the IF undistorted complex signal for providing an IF predistorted complex signal. The IF predistorted complex signal from the complex mixer 30 is then fed into a complex-to-real converter 32 that converts the IF predistorted complex signal into an IF predistorted real signal $P_{IF}(t)$. The mixer 30 is used to adjust the phase and amplitude of the input signal by the baseband predistorted complex signal $\tilde{P}(t)$. The complex modulator 26 modulates $\omega_{IF}$ oscillator signal by the baseband undistorted complex signal $\tilde{d}_x(t)$ for complex upconversion. The baseband undistorted complex signal $\tilde{d}_x(t)$ modulates the $\omega_{IF}$ oscillator signal by $\exp[-j\omega_{IF}(t)]$. The complex modulated signal from the IF complex modulator 26 is converted by the complex to real converter 32 to provide the IF predistorted signal $P_{IF}(t)$, where $P_{IF}(t)=\Im[d_i(t-T_d)]|\tilde{P}(t)|\cos(\omega_{IF}t+\theta_{pd})+\Im[d_q(t-T_d)]|\tilde{P}(t)|\sin(\omega_{IF}t=\theta_{pd})$, where $\theta_{pd}$ is the arctangent of the ratio of the imaginery part over the real part of $\tilde{P}(t)$. The imaginary part of the IF predistorted signal $P_{IF}(t)$ is filtered because the imaginary part does not contain any useful information.

The IF predistorted real signal $P_{IF}(t)$ is then upconverted to a radio frequency (RF) by an RF upconverter 40 for providing an RF predistorted real signal $P_{RF}(t)$. The RF upconverter 40 is driven by an RF local oscillator 42 providing a local RF oscillator signal $\omega_{RF}$ to the RF upconverter 40. After upconverter to RF, the RF predistorted signal $P_{RF}(t)$ is equal to $[\Im[d_i(t+T_d)]|\tilde{P}(t)|\cos(\omega_{HPA}t+\theta_{pd})+\Im[d_q(t+T_d)]|\tilde{P}(t)|\sin(\omega_{HPA}t+\theta pd)]/2$, where $\omega_{HPA}=\omega_{IF}+\omega_{RF}$. The RF upconverter 40 feeds the RF predistorted real signal $P_{RF}(t)$ to a high power amplifier (HPA) 44 that amplifies the RF predistorted real signal into an amplified output signal having an $\omega_{HPA}$ frequency that is equal to $\omega_{RF}$ plus $\omega_{IF}$. The signal $P_{RF}(t)$ is amplified by the HPA 44 to gain power. The amplitude of the amplified output signal from the HPA 44 is amplitude and phase distorted according to the nonlinear characteristics of the HPA 44. The amplified output signal is fed into a second harmonic filter 50 providing an amplified filtered output signal that is then broadcasted by an antenna 52 to a remote receiver 54. The amplified filter output signal using adaptive predistortion has reduced amplitude distortion and phase distortion.

The adaptive predistortion of the adaptive predistorter system is enabled by closed-loop feedback complex baseband predistortion processing by the adaptive predistorter 24. The amplified output signal from the HPA 44 is attenuated by a gain attenuator 46 providing an attenuated output signal that is then downconverted to IF using an RF to IF downconverter 48 that is driven by the $\omega_{RF}$ signal from the RF local oscillator 42 to downconvert the attenuated output signal for providing an IF output signal. Before the output signal from the HPA 44 can be fed back to the adaptive predistorter, the amplified output signal must be attenuated due to excessive power for conventional down conversion by the RF to IF converter 48. The IF output signal from the RF to IF downconverter 48 is then fed into an IF to baseband downconverter 56 using the $\omega_{IF}$ oscillator signal from the IF local oscillator 28 to provide a baseband output signal. The baseband output signal from the IF to baseband downconverter 56 is then fed into a real to complex converter 58 to provide a baseband complex output signal $\tilde{d}_z(t)$ that is then fed into the adaptive predistorter 24 for feeding back under closed-loop control the amplified filtered attenuated and downconverted output signal for closed-loop complex baseband adaptive predistortion. The fed back RF output signal passes through two downconverters 48 and 56 for baseband processing in the adaptive predistorter 24 using the local oscillator signals $\omega_{IF}$ and $\omega_{RF}$. After downconversion, the output signal will be at the lower baseband frequency for baseband processing in the adaptive predistorter 24. Before baseband processing in the adaptive predistorter 24, the fed back output signal is converted into the complex output signal $\tilde{d}_z(t)$ by the real to complex converter 58. This real to complex conversion reduces the processing time of the adaptive predistorter 24. Hence, the adaptive predistorter 24 receives the baseband undistorted complex input signal $\tilde{d}_x(t)$ from the input 10, and receives the baseband complex output signal $\tilde{d}_z(t)$ through feed back from the HPA 44, for closed-loop complex baseband operation on the complex baseband input and output to provide the baseband predistorted complex signal $\tilde{P}(t)$. The feed back through the adaptive predistorter 24 enables adaptive predistortion that continuously monitors the amount of distortion caused by the HPA 44. The adaptive predistorter 24 can adjust the amount of predistortion of the baseband undistorted complex input $\tilde{d}_x(t)$ in response to variations of the characteristics of the HPA 44 due to factors such as age and ambient temperature. The fed back baseband distorted complex output signal $\tilde{d}_z(t)$ initially has a distorted phase and amplitude respecting the baseband undistorted complex input signal $\tilde{d}_x(t)$ due to amplification by the HPA 44. The adaptive predistorter 24 preferably follows the Log-Linear model to estimate the amount of predistortion required to reduce the amount of distortion of the amplified output signal. Thus, the adaptive predistorter 24 adapts the amount of predistortion of the baseband undistorted complex input signal $\tilde{d}_x(t)$ to adaptively match the nonlinearity of the HPA 44 so that the HPA amplified output signal is linearized to the input signal 10.

Figure 2:
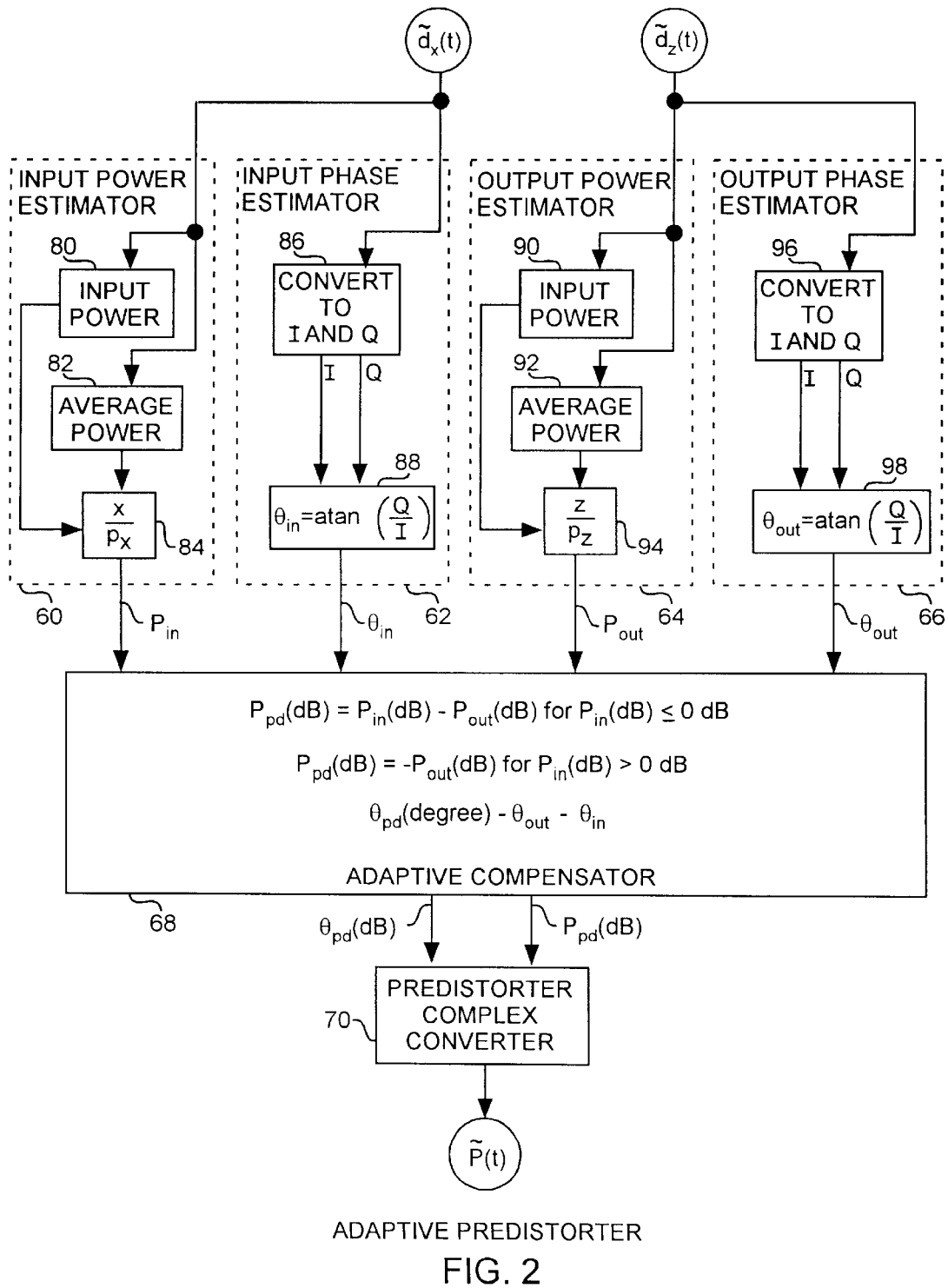
FIG. 2 is a block diagram of an adaptive predistorter.

Referring to FIGS. 1 and 2, and more particularly to FIG. 2, the adaptive predistorter 24 receives the baseband undistorted complex input signal $\tilde{d}_x(t)$ and the baseband distorted complex output signal $\tilde{d}_z(t)$ and generates the baseband predistorted complex signal $\tilde{P}(t)$. The baseband undistorted complex input signal $\tilde{d}_x(t)$ is fed into an input power estimator 60 and an input phase estimator 62, while baseband distorted complex output signal $\tilde{d}_z(t)$ is fed into an output power estimator 64 and an output phase estimator 66. The input power estimator 60 provides an input power signal $P_{in}$ and the input phase estimator 62 provides an input phase signal $\theta_{in}$. The output power estimator 64 provides an output power signal $P_{out}$ and the output phase estimator 66 provides an output phase signal $\theta_{out}$. The input power estimator 60 and output power estimator 64 respectively receive the undistorted input signal $\tilde{d}_x(t)$ and distorted output signal $\tilde{d}_z(t)$ and function to respectively divide the instantaneous power with the average power for respectively providing $P_{in}$ and $P_{out}$. The input phase estimator 62 and output phase estimator 66 also respectively receive the undistorted input signal $\tilde{d}_x(t)$ and distorted output signal $\tilde{d}_z(t)$ and respectively function to convert the input signal $\tilde{d}_x(t)$ and output signal $\tilde{d}_z(t)$ into two orthogonal component signals I and Q and then respectively compute the respective phases $\theta_{in}$ and $\theta_{out}$ between I and Q components of the baseband undistorted complex input signal $\tilde{d}_x(t)$ and baseband distorted complex output signal $\tilde{d}z(t)$. The $P_{in}$, $\theta_{in}$, $P_{out}$ and $\theta_{out}$ signals are received by an adaptive compensator 68 for generating a predistortion phase signal $\theta_{pd}$ and a predistortion power signal $P_{pd}$. The predistortion phase signal $\theta_{pd}$ and the predistortion power signal $P_{pd}$ are combined in a predistorter complex converter 70 for generating the baseband predistorted complex signal $\tilde{P}(t)$.

The input power estimator 60 includes an instantaneous input power detector 80, an average input power detector 82 and an input power divider 84 for generating $P_{in}$. The input phase estimator 62 includes an I and Q converter 86 and an I and Q phase calculator 88 for generating $\theta_{in}$. The output power estimator includes an instantaneous output power detector 90, an average output power detector 92 and an output power divider 94 for generating $P_{out}$. The output phase estimator 66 includes an I and Q converter 96 and an I and Q phase calculator 98 for generating $\theta_{out}$. The input and output power and phase estimators 60, 62, 64 and 66 provide the $P_{in}$, $\theta_{in}$, $P_{out}$ and $\theta_{out}$ power and phase signals to the adaptive compensator 68 for generating the predistortion phase signal $\theta_{pd}$ and the predistortion power signal $P_{pd}$ to the complex converter 70 for generating the complex predistortion signal $\tilde{P}(t)$. The adaptive compensator 68 generates the amount of predistortion in terms of the amplitude $P_{pd}$ and the phase $\theta_{pd}$. The desired amount of predistortion from the adaptive predistorter 24 preferably satisfies power conditions, where $P_{pd}=P_{in}-P_{out}$ for $P_{in} \leq 0$ and $P_{pd}=P_{out}$ for $P_{in}>0$, and $\theta_{pd}=\theta_{out}-\theta_{in}$, as a difference in phase between the input and output. The amount of predistortion is based on the Linear-Log model. The predistorter complex converter 70 then generates the estimated baseband predistortion complex signal $\tilde{P}(t)$ equal to the amount of dynamic adaptive predistortion in complex form.

In the input phase estimator 62, the converter 86 separates the I and Q components from the $\tilde{d}_x(t)$ signal, and the calculator 88 generates the phase $\theta_{in}$ that is equal to the arctangent of Q divided by I where I and Q are components of the $\tilde{d}_x(t)$ input signal. In the output phase estimator 66, the converter 96 separates the I and Q components from the $\tilde{d}_z(t)$ output signal, and the calculator 98 generates the phase $\theta_{in}$ that is equal to the arctangent of Q divided by I where I and Q are components of the $\tilde{d}_z(t)$ output signal. In the input power estimator 60, the input power of the $\tilde{d}_x(t)$ input signal is detected for instantaneous power x by the input power detector 80 and divided by the average power $P_x$ from the average power detector 82 for generating $P_{in}$. In the output power estimator 66 the output power of the $\tilde{d}_x(t)$ output signal is detected for the instantaneous power x by the output power detector 90 and divided by the average power $P_x$ from the averagae power detector 92 for generating $P_{out}$.

Referring to FIGS. 1 through 4, and more particularly to FIGS. 3 through 4, the function of the adaptive predistorter 24 can be graphed for comparisons. The output power Power Out is related to the input power Power In. The output power $P_{out}$ and the input power $P_{in}$ are normalized to respective maximum values. The input phase $\theta_{in}$ and output phase $\theta_{out}$ are expressed as a phase change signal to the input power Power In. The output power $P_{out}$ are represented by AM-AM characteristics curves of FIG. 3, while a $\theta_{out}$ minus $\theta_{in}$ phase change signal is represented by AM-PM characteristics curves of phase conversion of FIG. 4, each of which is a function of a normalized input power Power In. The power conversion, as shown in FIG. 3, is initially linear, but once the output power approaches the saturation point, the conversion becomes non-linear. Unlike the AM-AM curve, the AM-PM conversion lacks linearity in the region of small input power but gains linearity toward the region of large input power. Because of the nonlinear output characteristics of the HPA, the adaptive predistorter 24 is used to linearize the output signal to the input signal over operating values of power of the input signal 10. The output signal equals the input signal when the input amplitude is directly proportional to the output amplitude and the output signal is not phase distorted. Because of the nonlinearity of the output power and phase, the predistortion linearizes the output signal while distorting the input signal before amplification. The amplified output signal is fed back so that the predistorter 24 can adaptively adjust under closed loop processing, the amount of phase and power predistortion used to predistort the input signal. Thus, the predistorter 24 adapts the amount of distortion by processing the input and output signals under close loop control.

Referring to all of the Figures, and more particularly to FIGS. 5 through 5C, numerical results may be obtained by conventional simulations for generation of performance results. Performance results are depicted in FIGS. 5A through 5C. The normalized input power spectral density is shown in FIG. 5A. The output power spectral density without predistortion is shown in FIG. 5B. The predistorted output power spectral density is shown in FIG. 5C. Without predistortion, the output signal is degraded and there is spectral regrowth as a consequence of the nonlinearity of the HPA outside the main spectrum of the input signal as shown in FIG. 5B. As shown in FIG. 5C, there is a decrease in spectral regrowth of the output signal that more closely represents the original input signal using adaptive predistortion of the input signal prior to amplification by the HPA. Those skilled in the art can make enhancements, improvements, and modifications to the invention, and these enhancements, improvements, and modifications may nonetheless fall within the spirit and scope of the following claims.

What is claimed is:

1. A system for generating predistortion phase and predistortion power for linearizing a complex output to a complex input, the system comprising,
    an input power estimator for receiving the complex input and generating input power,
    an input phase estimator for receiving the complex input and generating input phase,
    an output power estimator for receiving the complex output and generating output power,
    an output phase estimator for receiving the complex output and generating output phase, and
    a compensator for receiving the input power and input phase and output power and output phase for generating the predistortion power and predistortion phase.

2. The system of claim 1 further comprising,
    a converter for converting the predistortion power and predistortion phase into complex predistortion.

3. The system of claim 1 further comprising,
    a converter for converting the predistortion power and predistortion phase into complex predistortion, and
    an amplifier means for amplifying the predistorted complex input distorted by the complex predistortion for providing the complex output, the amplifier means introducing phase and amplitude distortion during amplification of the predistorted complex input, the complex predistortion serving to cancel the phase and amplitude distortion so that the complex output is linearized to the complex input.

4. The system of claim 2 wherein,
    the input power is $P_{in}$,
    the output power in $P_{out}$,
    the input phase in $\theta_{in}$,
    the output phase is $\theta_{out}$,
    the phase predistortion is $\theta_{pd}$,
    the power predistortion is $P_{pd}$,
    $P_{pd}=P_{in}-P_{out}$ for $P_{in} \leq 0$,
    $P_{pd}=P_{out}$ for $P_{in}>0$, and
    $\theta_{pd}=\theta_{out}-\theta_{in}$.

5. The system of claim 1 wherein,
    the complex input is a baseband complex input,
    the complex output is a baseband complex output, and
    the input power estimator and the output power estimator and the input phase estimator and the output phase estimator and the compensator operate at baseband on the baseband complex input and on baseband complex output.

6. A system for linearizing a complex output to a complex input, the system comprising,
    an adaptive predistorter for receiving the complex input and receiving the complex output and for generating complex predistortion,
    a mixing means for mixing the complex predistortion with the complex input for generating a predistorted output,
    an amplifier for amplifying the predistorted output into an amplified output, the amplifier introducing distortion during amplification, and
    a feedback means for feeding back and converting the amplified output into the complex output, the mixing means providing predistortion to the complex input for linearizing the complex output to the complex input.

7. The system of claim 6 wherein,
    the adaptive predistorter provides predistortion for the complex input for linearizing the complex output to the complex input.

8. The system of claim 6 wherein,
    the complex input is a baseband signal,
    the complex output is a baseband signal, and
    the adaptive predistorter operates at baseband.

9. The system of claim 6, wherein the complex input is a baseband signal, the complex output is a baseband signal, and the adaptive predistorter operates at baseband, the mixing means comprises, an IF complex modulator for modulating an IF local oscillator by the complex input for providing an IF complex input, a mixer for mixing the IF complex input with the complex predistortion for generating an IF predistorted complex output, a real converter for converting the IF predistorted complex output into an IF predistorted real output, and a RF upconverter for upconverting the IF predistorted real output into the predistorted output at RF, the amplified output of the amplifier is an RF amplified output.

10. The system of claim 6, wherein the complex input is a baseband signal, the complex output is a baseband signal, and the adaptive predistorter operates at baseband, and the amplified output is an RF amplified output, the feedback means comprises, an RF downconverter for downconverting the RF amplified output into an IF output, an IF downconverter for downconverting the IF output into a baseband output, and a complex converter for converting the baseband output into the complex output at baseband.

11. The system of claim 6, wherein the complex input is a baseband signal, the complex output is a baseband signal, and the adaptive predistorter operates at baseband, and the amplified output is an RF amplified output, the feedback means comprises, an attenuator for attenuating the RF amplified output into an RF attenuated output, an RF downconverter for downconverting the RF attenuated output into an IF output, an IF downconverter for downconverting the IF output into a real baseband output, and a complex converter for converting the real baseband output into the complex output at baseband.

12. The system of claim 6 wherein, the complex input is generated from a digital input, the system further comprising, a serial to parallel converter for converting the digital input into I and Q channel signals, I and Q channel filters for respectively filtering the I and Q channel signals into I and Q filtered signals, I and Q channel delays for respectively delaying the I and Q filtered signals into I and Q delayed signals, and complex converter for converting the I and Q delayed signals into the complex input.

13. A system for linearizing a baseband complex output to a baseband complex input, the system comprising, an adaptive predistorter for receiving the baseband complex input and receiving the baseband complex output and for generating baseband complex predistortion, an IF complex modulator for modulating an IF local oscillator by the baseband complex input for providing an IF complex input, a mixer for mixing the IF complex input with the baseband complex predistortion for generating an IF predistorted complex output, a real converter for converting the IF predistorted complex output into an IF predistorted real output, an RF upconverter for upconverting the IF predistorted real output into an RF predistorted real output, an amplifier for amplifying the RF predistorted real output into an RF amplified output, the amplifier introducing distortion between the RF predistorted real output and the amplified output, the baseband complex predistortion linearizing the baseband complex output to the baseband complex input, an RF downconverter for downconverting the RF amplified output into an IF real output, an IF downconverter for downconverting the IF real output into a baseband real output, and a complex converter for converting the baseband real output into the baseband complex output.

14. The system of claim 13 further comprising, an attenuator for attenuating the RF amplified output.

15. The system of claim 13 wherein the system receives a digital input, the system further for converting the digital input into the baseband complex input, the system further comprising, a serial to parallel converter for converting the digital input into I and Q channel signals, I and Q channel filters for respectively filtering the I and Q channel signals into I and Q filtered signals, I and Q channel delays for respectively delaying the I and Q filtered signals into I and Q delayed signals, and complex converter for converting the I and Q delayed signals into the complex input.

* * * * *